United States Patent [19]

Vokac

[11] Patent Number: 5,663,727
[45] Date of Patent: Sep. 2, 1997

[54] FREQUENCY RESPONSE ANALYZER AND SHAPING APPARATUS AND DIGITAL HEARING ENHANCEMENT APPARATUS AND METHOD UTILIZING THE SAME

[75] Inventor: Peter R. Vokac, Tucson, Ariz.

[73] Assignee: Hearing Innovations Incorporated, Tucson, Ariz.

[21] Appl. No.: 494,295

[22] Filed: Jun. 23, 1995

[51] Int. Cl.$^6$ ................................................ H03M 1/00
[52] U.S. Cl. .......................................... 341/132; 381/68.4
[58] Field of Search ........................... 341/132; 381/68.4; 364/724.01

[56] References Cited

U.S. PATENT DOCUMENTS

| | | | |
|---|---|---|---|
| 4,887,299 | 12/1989 | Cummins et al. | 381/68.4 |
| 5,027,410 | 6/1991 | Williamson et al. | 381/68.1 |

*Primary Examiner*—Brian Young
*Attorney, Agent, or Firm*—Rothwell, Figg, Ernst & Kurz

[57] ABSTRACT

A signal frequency analyzer and frequency response shaping apparatus using digital techniques and apparatus and methods using the same which is applicable, in one embodiment thereof, to the enhancement of hearing in hearing impaired persons. Analog techniques are used in another embodiment of the invention. The invention includes hearing enhancement apparatus and methods which employ digital transformation, processing and memory functions for performing a wide range of hearing enhancement functions including the control of instantaneous signal gain levels as a function of instantaneous frequency and amplitude values of an audio signal. In another embodiment, the invention is applicable as a simple and inexpensive frequency analyzer which provides many of the characteristics of a complete Fast Fourier Transform (FFT) suitable for audio signals and other signals where a lower resolution FFT equivalent is acceptable.

15 Claims, 6 Drawing Sheets

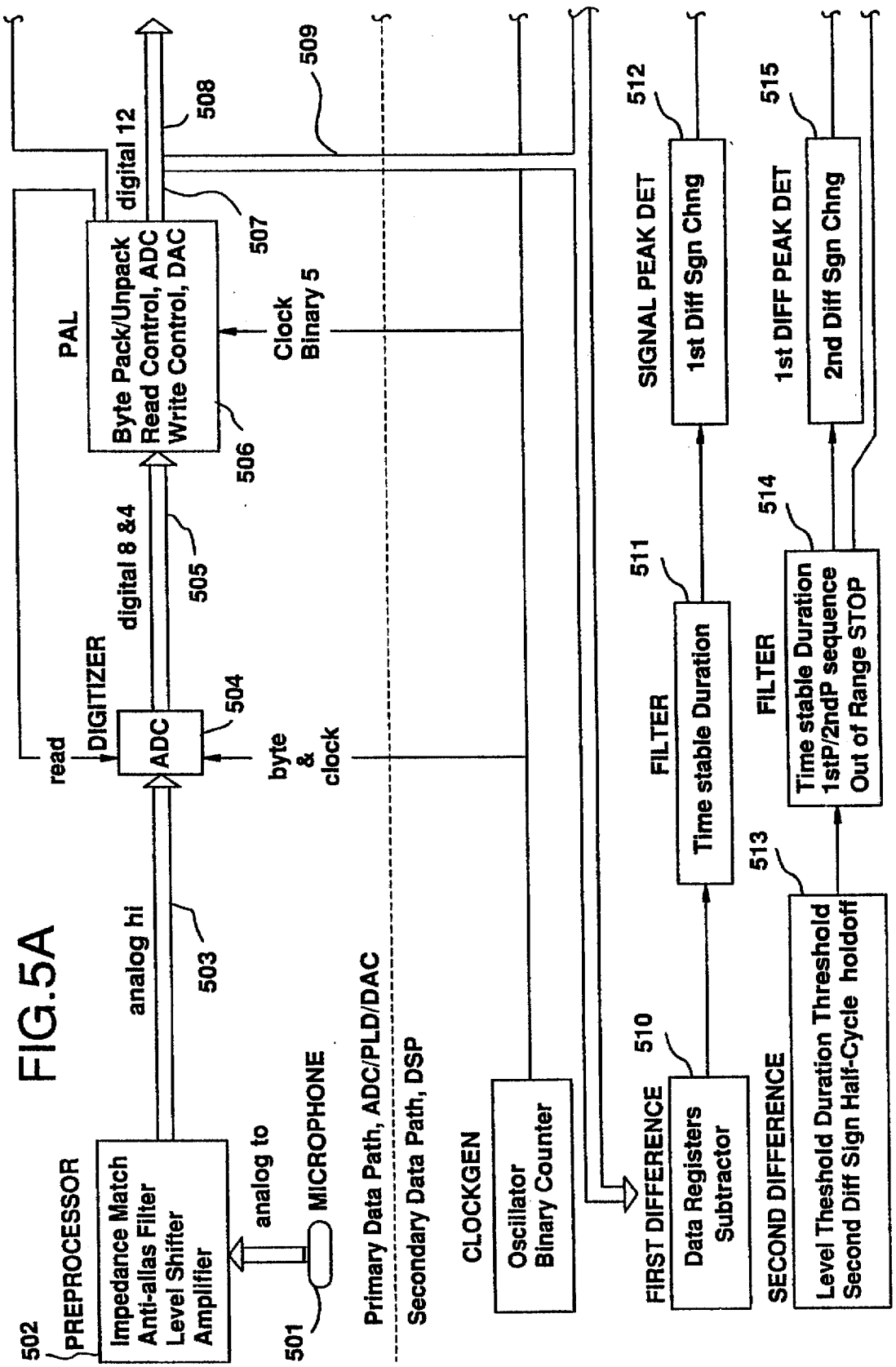

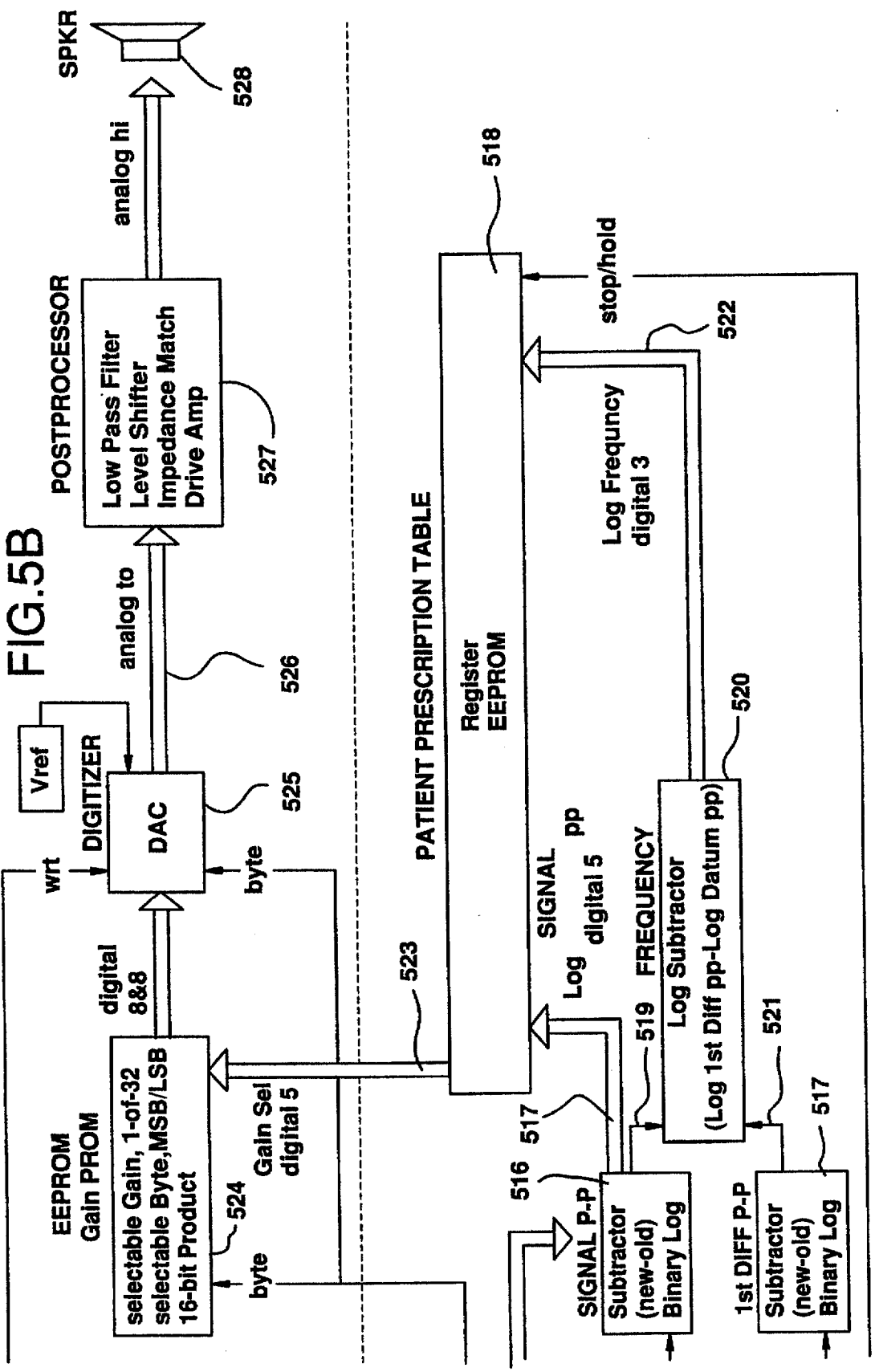

FREQUENCY RESPONSE ANALYZER AND SHAPING APPARATUS AND DIGITAL HEARING ENHANCEMENT APPARATUS AND METHOD UTILIZING THE SAME

The present invention relates to a signal frequency analyzer and frequency response shaping apparatus using digital techniques and to apparatus and methods using the same for the enhancement of hearing in hearing impaired persons and in particular to a hearing enhancement apparatus and method which employs digital transformations and processing for performing a wide range of hearing enhancement functions. The invention is useful in hearing aids of various types and in apparatus which relates in general to the improvement and enhancement of the human hearing response. The invention is also applicable as a simple and inexpensive frequency analyzer which provides many of the characteristics of a complete Fast Fourier Transform (FFT) suitable for audio signals and other signals where a lower resolution FFT equivalent is acceptable.

BACKGROUND OF THE INVENTION

Various types of hearing aids and hearing enhancement apparatus are known in the prior art. Some of these devices utilize the transmission of sound waves through the air from the device to the human sensory system, such as to the cochlea, and others utilize other media such a vibratory contact with the body as the medium of transmission. For example, in U.S. Pat. No. 4,982,434—Lenhardt et al., there is disclosed a hearing enhancement device which utilizes direct vibratory contact with the human body and transmission of modulated ultrasonic sound waves within the body, such as though bone conduction, as the medium of stimulating the hearing response. Other types of hearing enhancement devices utilize transmission of sound wave waves through the air for interaction with the cochlea as the medium of stimulating the hearing response.

Some of these prior art systems utilize digital signal processing to perform various functions in the hearing enhancement process. However, the use of digital technology in miniaturized, light weight, portable hearing enhancement devices that can be carried on the person and worn in low visibility mounting arrangements has been severely limited because of the high cost and complexity of the digital circuitry and the high power consumption required for the full implementation of desired functions.

In addition, in the case of electronic circuitry of all types as applied to such types of prior art devices, once the circuitry is embodied in the apparatus, the characteristics provided thereby remain fixed and therefore the adaptability of such prior art devices to custom applications and to the specific needs of particular patents has been limited.

It is an object of the present invention to overcome these disadvantages of the prior art, particularly in relation to the utilization of digital technology in hearing enhancement devices.

It is also an object of the present invention to provide a simplified and inexpensive digital frequency response analyzing and shaping apparatus and method which detects the instantaneous frequency of a signal and converts the same to a transform and which adjusts the amplification of the signal over a frequency spectrum as a function of the frequency dependent transform.

It is a further object of the present invention to provide an apparatus and method for customizing a frequency dependent signal amplification characteristic which matches and compensates for the deficiencies in the hearing response of a particular patient and which can be field programmed at the point of application based on the measured hearing characteristics of the patient and set in a programmable memory in the form of a patient prescription table (PPT).

It is also an object of the present invention to provide a simple and inexpensive digital apparatus and method for determining the instantaneous frequency of a time varying signal in a manner that is much simpler than methods based on Fast Fourier Transforms and similar methods known in the art.

It is a further object of the invention to provide an innovative author-friendly experimental platform for testing and evaluating the psychophysical effects of enhancement methods, known and unknown, in the present state of the art. The invention enables program changes in situ that control and modify system behavior extensively, including even the addition of new processing features.

SUMMARY OF THE INVENTION

The present invention employs a digital intelligent signal analyzer/corrector that incorporates novel systems and methods for performing the functions of hearing enhancement and which has other applications as well. The system may be configured as a battery-powered stand-alone digital device applicable to embodiments having either audio frequency outputs for air interface to the user or ultrasonic frequency outputs for bone or flesh interface to the user. The device in either embodiment is packaged for being carried in a belt, a shirt pocket, attached behind the ear, or for in-the-ear applications, enabling tradeoffs in range of features and battery power.

Since, in a preferred embodiment of the present invention, the device is virtually entirely digital in operation, one of its most rigorous requirement is low power consumption. The use of very low power components is attained by the novel use of Electrically Erasable Programmable Read Only Memory, EEPROM, technology, and by use of complementary novel Digital Signal Processor, DSP, algorithms in the audio that are simple enough to enable a minimal microcontroller to operate the system at sufficiently high throughput to maintain good audio quality. The novel method by which this is achieved involves the separation of data flow into two streams separated according to throughput requirements. The primary stream with high throughput is processed by EEPROM. The secondary stream with low throughput is processed by microcontrollers.

In addition, the combination in the present invention of the novel EEPROM and DSP technologies enables the attainment of the highest effective sampling rates and provides as well for field programmability and reprogrammability based on data taken directly from patient audiograms. Thus, the EEPROM can be programmed to include, for example, a "patient prescription table" (PPT) taken directly from an audiologist's diagnostic audiogram to fully define the device behavior so as to optimally compensate for the patient's hearing impairment. If the patient's needs change with time, the device can be reprogrammed accordingly on an out-patient basis.

System applications include a broad range of applications in hearing enhancement including intelligent compressive and adaptive amplification, noise discrimination and rejection, spectral sharpening, frequency shifting, and active loudness cancellation.

BRIEF DESCRIPTION OF THE DRAWINGS

FIG. 5 is a complete block diagram of a hearing enhancement system embodying the present invention.

DETAILED DESCRIPTION OF THE INVENTION

Figure 1:
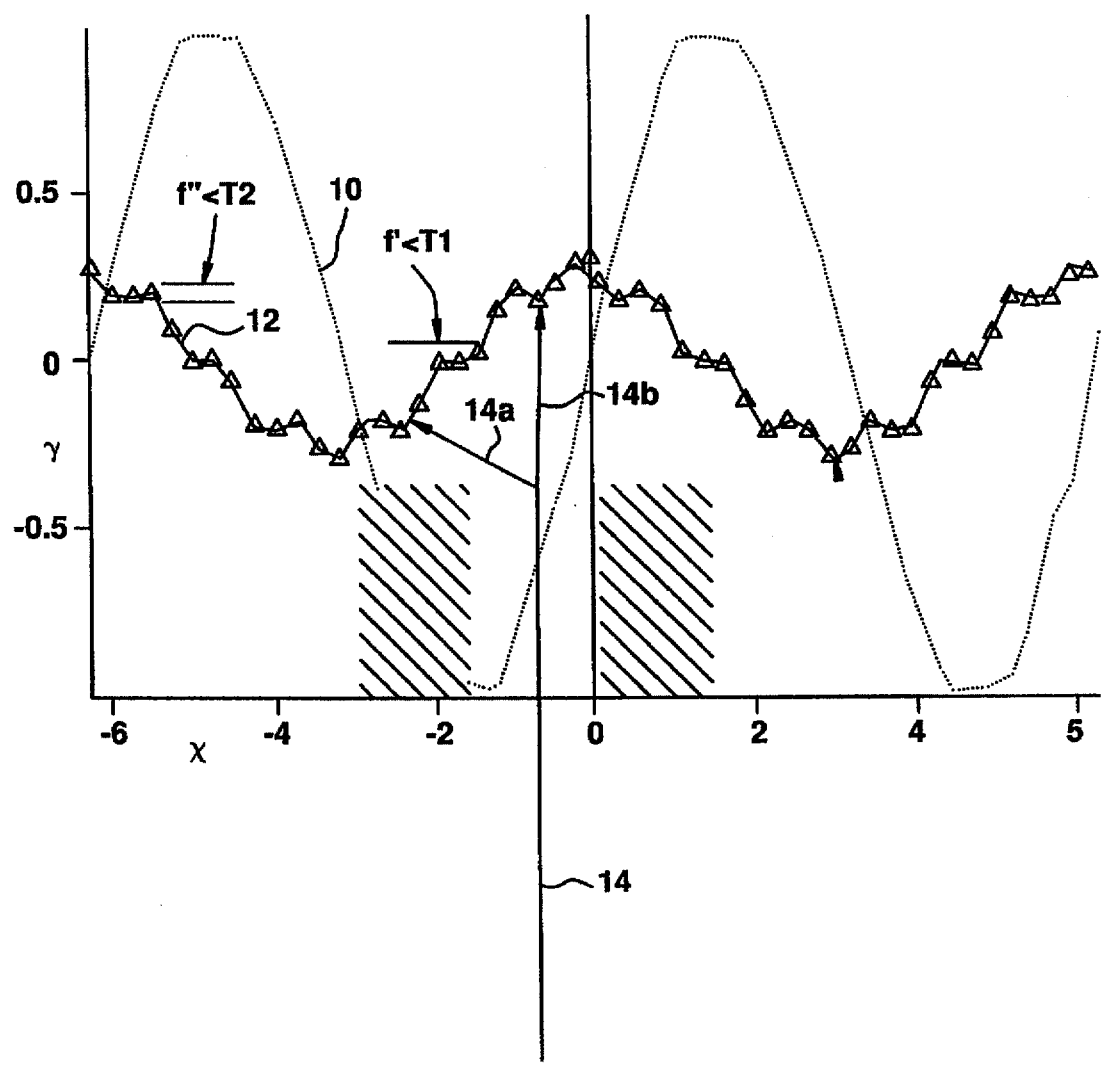
FIG. 1 illustrates a time varying signal which is to be analyzed and the first difference thereof and contains various notations used for explanation certain aspects of the present invention.

The present invention, in one embodiment thereof, utilizes a novel digital signal processor (DSP) based apparatus and method for determining the instantaneous frequency of a signal to be analyzed and, in the case of the embodiment on the invention as applied to the enhancement of human hearing, applies the frequency information so determined to a frequency response shaping apparatus and method to customize the frequency response of the hearing enhancement apparatus for a selected frequency response characteristic. The digital apparatus and method of the present invention for determining the frequency of the signal will first be explained.

Consider first a sinusoidal function $f(t)=\sin(\omega t)$ representing a signal whose frequency is to be determined. The first derivative of f(t) with respect to time, f'(t), is $f'(t)=\omega \cos(\omega t)$. If a new function y(t) is obtained by dividing f'(t) by f(t), then:

$$y(t) = \frac{\omega \cos(\omega t)}{\sin(\omega t)} \qquad (1)$$

The function y(t) as defined in equation (1) is an unstable function which periodically goes to infinity as sin ($\omega$) goes through zero. I have noted, however, that if cos ($\omega t$) and sin ($\omega t$) are both defined at their peak values and, if it is assumed that these peak values are equal to each other, then the function y(t) becomes a fixed value which is no longer a function of time and which is equal to the frequency $\omega$ in radians per second of the signal f(t). This new identity is expressed as:

$$\omega = f'(t)_{peak}/f(t)_{peak} \qquad (2)$$

The use of this identity requires determining the adjacent peak values of f(t) and f'(t). This is accomplished in the present invention by identifying the zero crossing points of the first derivative f'(t) and the second derivative f"(t). That is, when f'(t) goes through zero, the signal f(t) goes through a peak and when f"(t) goes through zero, f'(t) goes through a peak. However, typical audio signals, as well as other signals of a similar nature which are to be analyzed, are not pure single frequency sinusoidal functions. Such signals usually contain a dominant tone which has superimposed thereon other frequencies such as those arising from noise and other effects as well as certain harmonics as well. The determination of the adjacent peak values of f(t) and f'(t) is therefore subject to false indications created by such superimposed signals. One of the important features of this invention is therefore directed to apparatus and methods for analyzing f(t) and f'(t) to determine the true peaks for these signals and to avoid "false peaks" that occur due to noise and other signals that are superimposed on the primary tone to be analyzed.

In the present invention, the signal f(t) is first converted from an analog signal into a digital signal. Digital signal processing methods are then employed in accordance with the present invention to detect the peak values of f(t) and f'(t) using detected zero crossings of f'(t) and f"(t) respectively as will be explained below.

Shown in FIG. 1 by a dotted line 10 are two cycles of a primary tone having superimposed thereon noise at seven times the primary frequency at 30 dB below the level of the primary tone. The noise is not visible in the dotted line 10 of the primary tone but shows up in the first difference of the primary tone signal, which is shown by the solid line 12. The first derivative 12 (the "first difference" in digital terms) of the primary tone 10 is derived by digital techniques which will be explained later. The terms "first difference", "second difference" and "third difference" as used herein mean the first, second and third derivatives respectively as taken for the digital function in each case. The use of the term "difference" in each case is customary in digital signal terms to designate the derivative as taken in the digital domain where the function is not a continuous function as in the case of the derivatives for the analog functions.

As shown in FIG. 1, the first difference of the primary tone 10 is taken at sampling points indicated by triangles. The triangle are shown connected by the continuous line 12 to illustrate the shape of the function f'(t). For the example shown, there are twenty five sampling points for each cycle of the primary tone signal 10. As will be observed from FIG. 1, the first difference function 12 is roughly sinusoidal in shape and is displaced in time by 90° from the signal f(t). Zero crossings of f'(t) thus occur at the peaks of f(t). Similarly, although not illustrated in FIG. 1, zero crossings of f"(t) occur at the peaks of f'(t).

Since the signal which is being processed is a digital signal and not a continuous analog signal, zero crossings are detected by detecting when the digital function falls below a selected threshold minimum value which represents zero in the digital domain. This minimum threshold value is selected in each case based on the digital characteristics of the signal being analyzed such that a reliable zero crossing threshold is effected.

In the case of the example shown in FIG. 1, a first threshold T1 is used for the zero crossing of the function f'(t). When f'(t) falls below the threshold level T1, a zero crossing of the function f'(t), and hence a peak of f(t), is indicated as a first criterion. However, in order to avoid a false peak, further tests are applied to determine if the detected zero crossing indicates a true peak.

The second threshold T2 is applied to the second difference of f(t), that is f"(t), and is applied to determine the zero crossings of f"(t) in the same manner as the threshold T1 is applied to the first difference f'(t).

Also applied with threshold tests for T1 and T2 are further steps and tests to avoid detection of false peaks in f(t) and f'(t). These are outlined as follows and will be explained in further detail below:

1. When a "true" first difference peak in f'(t) is detected, the system is "locked out" for the next quarter cycle between the detected first difference peak and the next peak of the primary data signal f(t). This avoids the detection of any false peaks during the lock-out period.
2. A change in the sign of f'(t) indicates a zero crossing of f'(t) and a new peak in the data signal f(t). The logic in the detection apparatus is set to respond to a sign change and indicate a zero crossing only when the detected sign change is preceded by a selected n samples which are the same sign as the last sample before the sign change. This method rejects high frequency effects. In the present invention, a preferred number of samples n is five.

3. Noisy signals have spikes that are not true signal peaks. Back to back polarity changes are rejected to avoid a peak detection response to such spikes.

4. The correct polarity of the second difference "expected next to occur" f"(t) is determined at each zero crossing point and, if the next to occur detected zero crossing does not yield the expected polarity, the detection is rejected as a false peak. That is, if f"(t) goes from minus to plus in polarity at a zero crossing, then the next expected change in polarity is from plus to minus. If that expected polarity change does not occur, the detected zero crossing is rejected as a false peak.

5. When the logic in the system detects "a missing element in the expected alternating sequence of first difference and data peaks" caused by lockouts resulting from any of the above applied criteria, address register updates to the "Patient Prescription Table" (PPT) of the system are disabled. By this means, the system avoids gain changes in the presence of spurious signals. Instead, it maintains the last accurate value until the signal quality improves. This function will be explained in further detail below.

For example, in the case of test number 2 above, arrow 14 and its branches 14a and 14b point to false peaks in f'(t) in which concave peaks (those dipping downwardly and then upwardly) occur after a preceding true concave peak in f'(t). The direction of the sign change in f"(t) for the false peaks noted by 14a and 14b will thus be the same as the direction of the sign change in f"(t) for the immediately preceding true peak in f'(t). The logic of the system is set to require that each next succeeding true peak of f'(t) have a sign change direction in f"(t) which is the opposite of that occurring in the immediately preceding sign change of f"(t), that is, that each concave peak be followed by a convex peak and then a concave peak and so on. Since the direction of the sign changes in f"(t) for the peaks indicated by 14a and 14b are the same as for the immediately preceding true peak, peaks at 14a and 14b fail this test and are thus rejected as false peaks.

Figure 2:
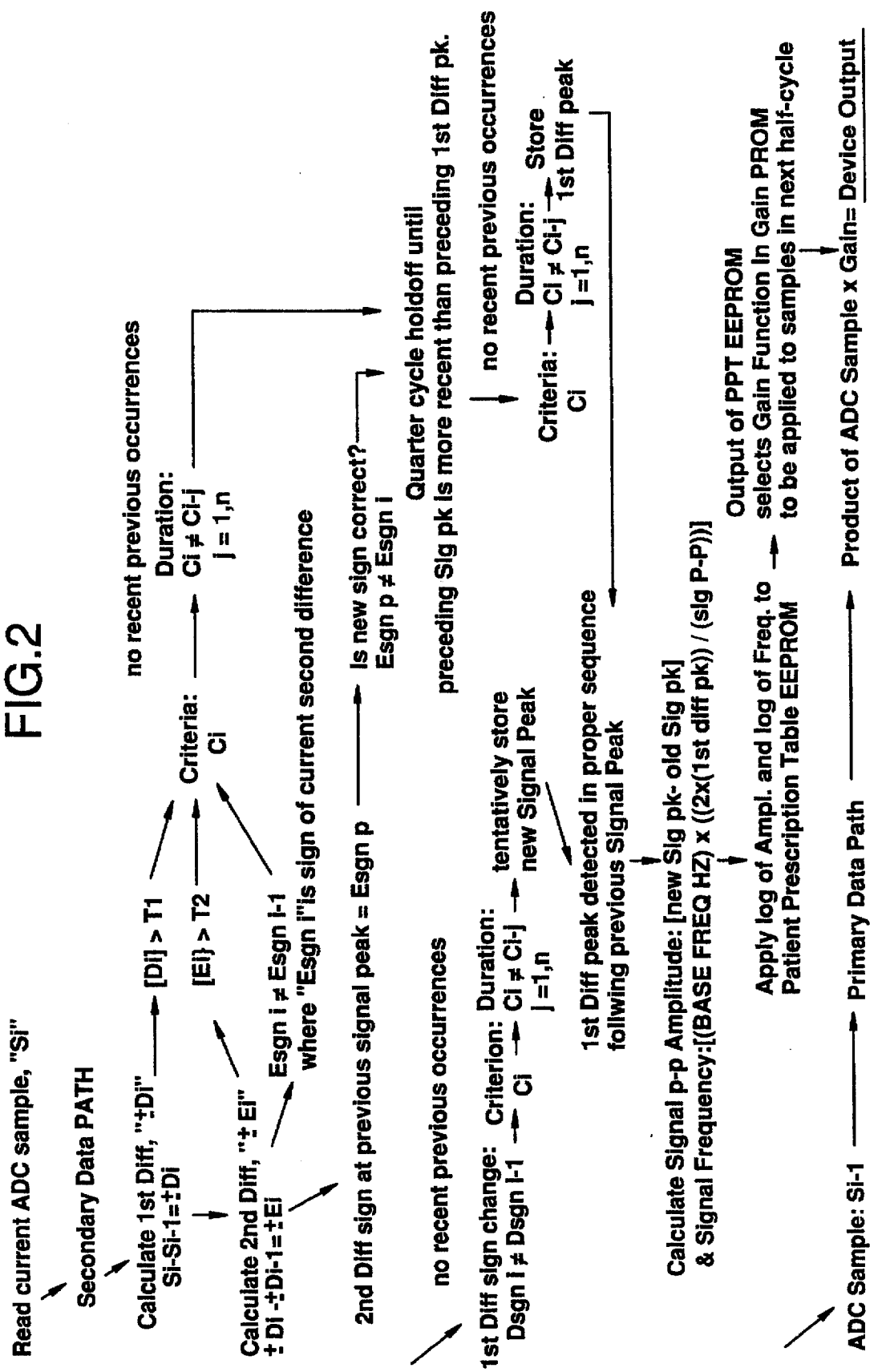
FIG. 2 is a digital processing flow diagram illustrating the processing steps carried out in accordance with one aspect of the present invention.

A preferred sequence for performing these functions of false peak detection and related processing steps is illustrated in FIG. 2. The labels used in this diagram are self explanatory. Beginning in the upper left hand corner of the diagram of FIG. 2, the first and second differences of the digital signal S are calculated and are tested for duration (time between peaks), sign changes ("Esign" and "Dsign), recent occurrences, proper sequence and the like before being applied to a patient prescription table EEPROM (in a manner later to be explained) for selection of the proper gain function for the measured primary frequency and amplitude of the signal.

Since the actual audio signal in a typical hearing aid application may be a single polarity signal, the peaks of the signal must be determined in relation to each other. Thus, the peak values are actually peak-to-peak values represented by subtracting the value of the immediately preceding peak from the value of the present peak. Thus, the ratios used in the implementation of the method of the present invention are based on peak-to-peak values of the signal and the first difference of the signal. This is represented by the following:

$$\omega = f'(t)_{peak-to-peak} / f(t)_{peak-to-peak} \tag{3}$$

The foregoing description applies to the apparatus and methods of the present invention as applied to the detection of the true peaks in the primary frequency or primary tone of f(t) and in f'(t). After these peaks have been detected, they are applied to the derivation of the instantaneous frequency of the signal f(t) by using the relationship of equation (3).

Figure 6:
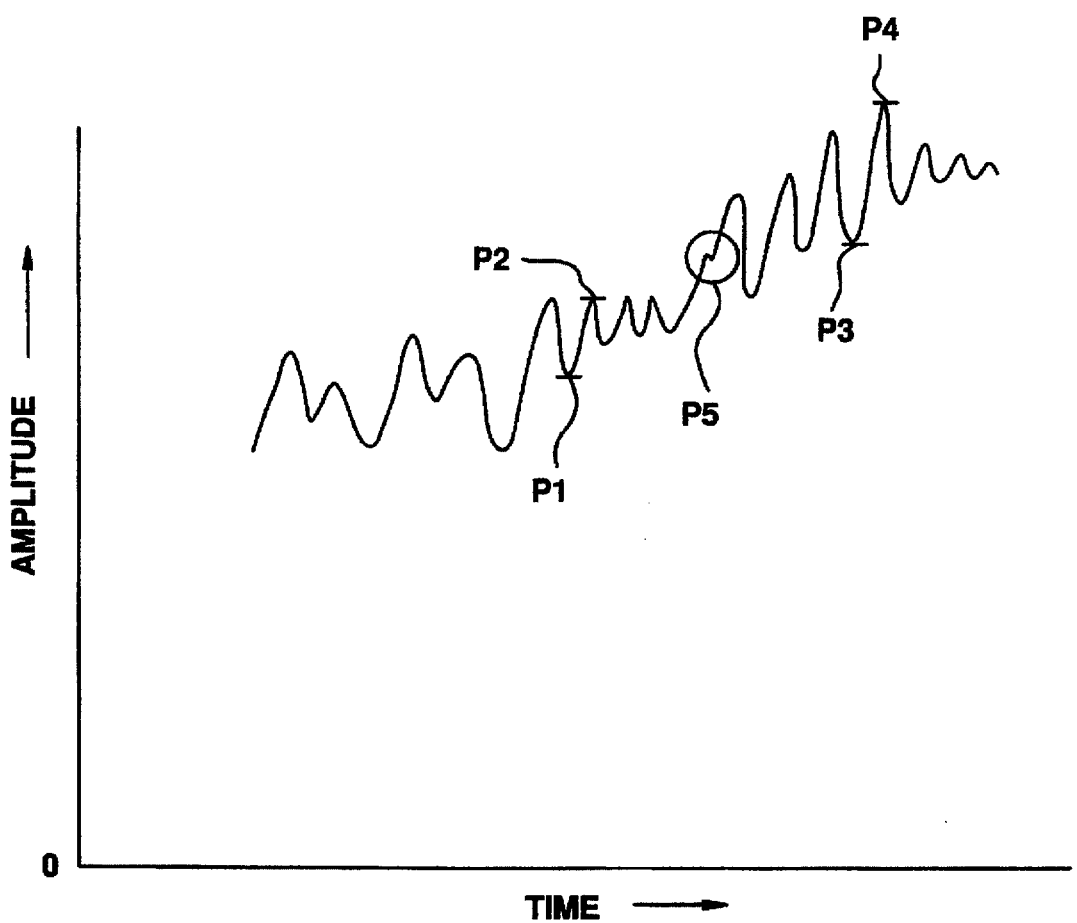
FIG. 6 is an illustration of a time varying signal showing the methodology of determining the peak-to-peak values of the primary frequency of the signal and demonstrating how the signal is processed through the system's filter algorithms.

The term "peak-to-peak" as used herein refers to the adjacent peak to peak values of the primary frequency or primary tone of a time varying signal. This is illustrated in FIG. 6 in which a time varying signal has at a selected point a lower peak P1 and an adjacent upper peak P2. The peak-to-peak value of the signal at this particular point in time is P1–P2. At another point in time, adjacent minimum and maximum peaks P3 and P4 are illustrated in FIG. 6. At this point in time, the peak-to-peak value of the signal is P4–P3. This same approach applies to the signal f(t) and to the first and second differences f'(t) and f"(t) except that the first and second differences are bipolar and the peak-to-peak values are thus more readily determined about the zero level.

In accordance with the present invention, filters are set to reject as false peaks (defined as those peaks which are not desired to be detected) those peaks which are either too small a period (i.e., too close together in time) or too small in amplitude. The frequency cut-off point at which peaks of too small a period are rejected can be selected at any desired maximum frequency below which it is desired to detect the primary frequency of the signal. The filter in this case is a low pass type filter which passes frequencies up to the selected maximum frequency at which primary frequencies of the signal are to be detected and which rejects frequencies above that level.

For example, if a maximum frequency of 8.0 KHz is selected, (called the "nominal frequency" herein), then peaks which are closer together in time than that represented by the selected 8.0 KHz upper frequency limit will be rejected. In FIG. 6, these might be represented by the peaks occurring at the region circled P5, which are much closer together than the remaining peaks and could thus be rejected by the filter mechanism based on the selected frequency criteria mentioned above. Similarly, the peak-to-peak values in the region P5 are relatively small in amplitude compared to those of the other peaks and would thus be rejected as false peaks which are not desired to be detected as true peaks of the primary frequency of the signal.

The characteristics of the system can thus be selected to respond to a selected frequency band and to detect and measure the primary frequency of the signal within the selected frequency band and below the maximum frequency at which false peak rejection is set to occur. For example, a particular audio signal may have either higher harmonics or noise content which are not desired to be detected by the frequency measuring function and are thus set to fall outside the range of true peaks accepted by the system. Once these criteria are set, the system rejects as false peaks those detected peaks which fall outside the selected acceptance criteria and the system detects and measures the instantaneous primary frequency of the signal which falls within the selected criteria.

Figure 3:
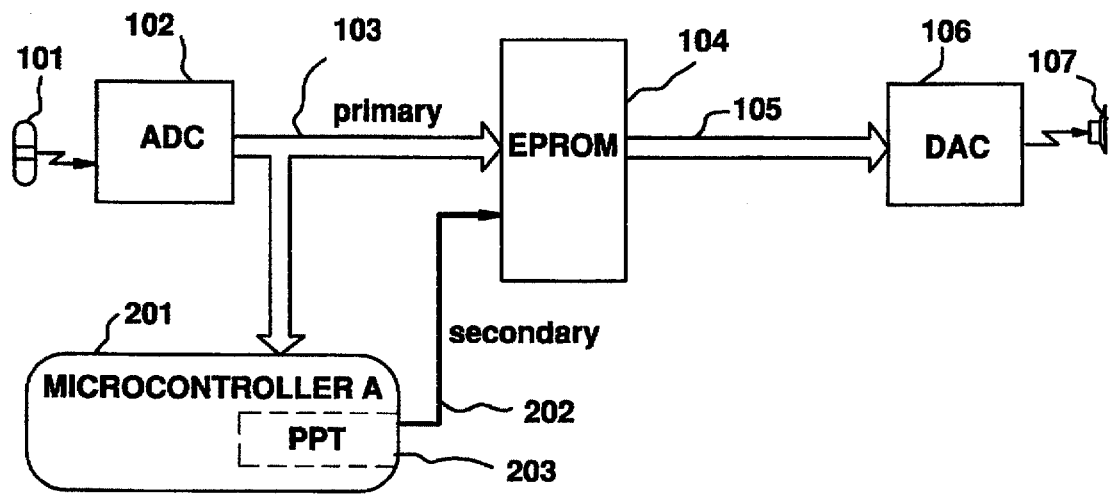
FIG. 3 is a simplified block diagram showing the primary and secondary paths utilized in one embodiment of the present invention.

A hearing enhancement device embodying the present invention is shown in simplified block diagram form in FIG. 3.

As is known to those skilled in the electronic art, an EEPROM can perform a complex isomorphic function much faster than a general purpose Digital Signal Processor (DSP). It is one innovative purpose of this invention, as applied to human hearing enhancement, to exploit that difference in capability by separating the hearing enhancement task into two separate data streams, as shown in the simplified block diagram of FIG. 3, according to throughput requirements. This enables the EEPROM to perform repetitive high speed tasks at a full digital sampling rate, while the digital signal processor (DSP) performs relatively low speed tasks at audio cycle rates that are more adaptive and interactive.

In the audio frequency embodiment of the invention as illustrated in FIG. 3, an audio signal such as taken from a microphone 101 is converted from an analog signal into a digital signal 103 by an analog to digital converter 102 which digitizes the analog audio signal and outputs an N-bit wide digital data stream 103. The digital signal 103 is connected through a primary path to a very low power EEPROM 104 and through a secondary path to a microcontroller 201, which includes a patient prescription table (PPT) 203. The EEPROM 104 performs an isomorphic transform on the digital audio, resulting in processed digital data stream 105 which is input to the audio Digital-to-Analog-Converter 106. The PPT 203 contains the stored results of a patient audiogram specifying the frequency response characteristics of the patient's hearing response.

The microcontroller 201 contains apparatus of the present invention for determining the instantaneous frequency and amplitude of the digitized audio signal and for utilizing the determined instantaneous frequency and amplitude values for interrogating the PPT 203 to determine the magnitude of the amplification or gain which is to be applied to the audio signal during the next half-cycle based on the measured frequency and amplitude of the audio signal and the patient's hearing response characteristics stored in the PPT 203.

The microcontroller 201 outputs a signal 202 which specifies the magnitude of the gain which is to be applied to the audio signal as determined from the instantaneous frequency and amplitude of the audio signal and the characteristics stored in the PPT 203. The signal 202 is connected to the low power EEPROM 104 which has programmed in it a multiplicity of isomorphic, but not necessarily linear, gain functions to be applied to the audio signal. The EEPROM 104 applies the stored gain functions to the primary audio signal based on the gain level specified by the signal 202 and outputs a digitally amplified audio signal 105 which is amplified in the manner just described based on the measured instantaneous frequency and amplitude of the audio signal and the instantaneous gain for that frequency prescribed by the PPT 203. Changes in the gain via the PPT 203 are enabled only at the first difference peaks points.

Since the low power EEPROM 104 is the only active element in the primary data stream, FIG. 1–104, and since the EEPROM can be switched in sub-microseconds, audio gain control within the device can be switched at signal zero crossings, precluding the "pop and click" artifacts caused by other hearing enhancement devices. Throughput requirements of the primary audio data stream are at sample rate frequencies which are many times higher than the highest audio frequencies.

The EEPROM 104 uses the fact that a cosine is an image of the sine, shifted in phase. For a given fixed sample rate in the EEPROM device 104, the signal frequency of the signal f(t) that produces a finite first difference peak result that is equal in amplitude to the signal peak (i.e., $f'(t)_{peak-to-peak}/f(t)_{peak-to-peak}$ equal to unity) is called the "nominal" frequency and it is derived as a constant. This is true when the samples occur at 60° intervals in the signal. The peak of f'(t) is at the zero crossing of the sine of the signal (sin 30°+sin 30°=1.0). The amplitude of a maximum sample at that point is equal to unity (the amplitude of the signal) when the sample spans 30° on each side of zero. Therefore, the nominal frequency where the peak-to-peak amplitude of the first difference f'(t) is equal to the peak-to-peak amplitude of the signal f(t) is given by:

Nominal signal frequency=[sample rate×($60/360$)]  (4)

In simpler terms, the sampling frequency should be six times the maximum signal frequency. For example, if a nominal signal frequency of 8.0 KHz is selected as the maximum signal frequency which is to processed by a hearing enhancement device, for example, then a sample rate of six times the nominal signal frequency, i.e., 48.0 KHz, produces a first difference peak-to-peak amplitude which is equal to the signal peak-to-peak amplitude at a signal frequency of 8.0 KHz. For signal frequencies less than 8.0 KHz, at which the sample interval spans less than 60°, the amplitude of the first difference f'(t) decreases approximately linearly with the frequency of the signal (because the sine function is approximately linear within ±30° of the zero cross over point).

The embedded microcontroller 201 is positioned in the secondary data stream, as shown in FIG. 3, where its throughput requirements are at relatively low audio frequencies. Its function is twofold: to detect zero crossings of the audio signal derivatives, and to select and enable functions, by means of signal 202, based upon the microcontroller's analysis of the signal. These functions are programmed in the EEPROM 104 as set forth above. In accordance with the present invention, zero crossings of the derivatives are detected to derive peak values of the signal and its derivatives and to calculate the frequency and amplitude of the incoming signal, cycle-by-cycle.

Figure 4:
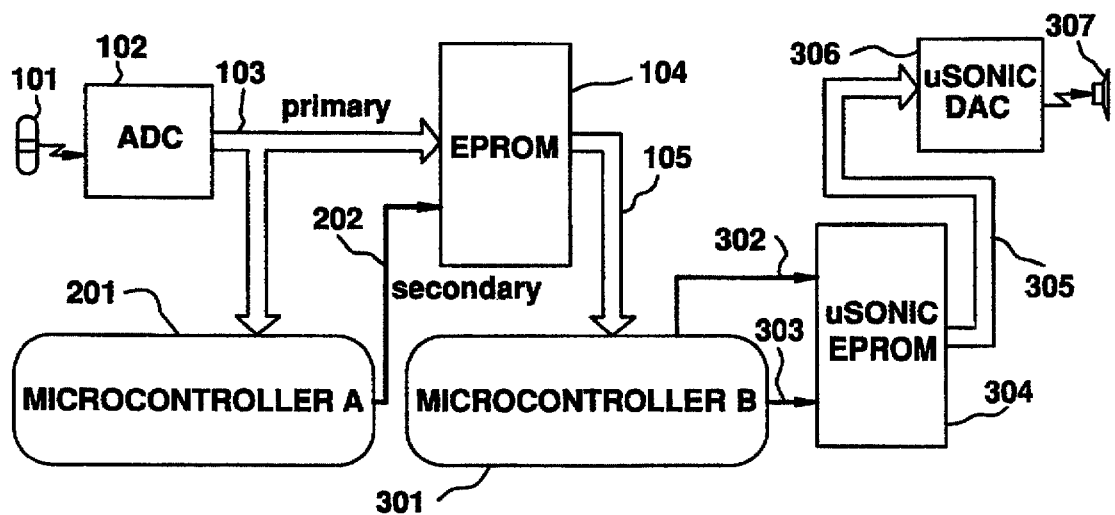
FIG. 4 is a simplified block diagram illustrating another embodiment of the present invention as applied to an ultrasonic hearing device.

In another embodiment of the invention as shown in FIG. 4, the invention is applied to an ultrasonic hearing aid of the type disclosed and claimed in U.S. Pat. No. 4,982,434—Lenhardt et al. In this embodiment, a second EEPROM 304 is placed in the primary data stream at the output of a second microcontroller 301. This second EEPROM 304 generates an ultrasonic carrier and performs the ultrasonic modulation function.

In this embodiment, the audio signal from microphone 101 as digitized by ADC 102 is separated into primary and secondary data paths as in the embodiment of FIG. 3, and the digitally amplified signal 105 is connected to the second microcontroller 301. The second microcontroller 301 outputs in parallel at 302 both the digital signal s(t) and its Hilbert Transform s'(t) for single sideband modulation of an ultrasonic carrier along with a set of ultrasonic carrier clocks 303, which define the variable t, and enable the EEPROM 304 to insert cosine and sine functions of an ultrasonic carrier frequency $w_c$ for an algorithm known to those skilled in the art as conjugate modulation.

The EEPROM 304 digitally modulates the audio signal from the first EEPROM 104 onto an ultrasonic carrier by means of an isomorphic function known to those skilled in the art as conjugate amplitude modulation. Throughput in this EEPROM 304 is many times higher than the throughput of the first EEPROM 104. The output result is an Amplitude Modulated Single Side Band (AMSSB) signal 305 containing enhanced audio frequencies riding within the upper side band of a carrier of programmable ultrasonic frequency. The resulting digitally amplified and single sideband amplitude modulated signal 305 is connected to an ultrasonic DAC 306, converted to analog form and applied to an output device 307 which may be a small vibrator or other auditory response stimulating device.

The second embedded microcontroller 301 in the ultrasonic embodiment of the invention is positioned in the primary audio data stream, where its throughput requirements are at high audio sample rates, and its functional requirements are more stringent. Its function is threefold: to calculate a running first difference on the signal data stream, to perform a real time log table lookup on both the signal data stream and on its first difference, and to generate programmable clocks for the second EEPROM to use in generating the ultrasonic carrier.

FIG. 5 shows a complete block diagram of a hearing enhancement device incorporating the present invention. In this embodiment, a microphone 501 converts an audio signal into an electrical analog audio signal which is processed in a preprocessor 502 for impedance matching and other functions to derive a preprocessed audio analog signal 503. The preprocessed audio analog signal 503 is digitized in an analog to digital converter (ADC) 504 into a digital audio signal 505 and further processed through a programmable array logic device 506 having functions such as byte pack and unpack and read and write controls.

A fully processed digital audio signal 507 is thus obtained and, at this point, is divided into a primary data path signal 508 and a secondary data path 509. The data are processed through the primary and secondary data paths in the manner described above in connection with the embodiment of FIG. 3. The processing will now be described in further detail with respect to the block diagram of FIG. 5.

Referring now to the secondary data path signal 509, which will for purposes of description be referred to as f(t), this is processed through a digital first difference device 510 for deriving the first difference of the signal 509, a time stable duration filter 511 and a signal peak detector 512, which detects, by means of zero crossings of the first difference of f(t), referred to as f'(t), the signal peak points at which f(t) reaches its peak values and the values of f(t) at the peak points. Circuitry for performing the functions of the digital first difference device 510 and the filter 511 for deriving f'(t) from f(t) are well known to those skilled in the art and will not be described further herein.

The signal 509 is also connected to a second difference device 513 for deriving the second difference f"(t) of the signal f(t), which is then connected through a filter 514 and a peak detector 515 which detects, by means of zero crossings of f"(t), the peak points at which f'(t) reaches its peak values and the values of f'(t) at the peak points. Again, circuitry for performing the functions of the elements 513, 514 and 515 is well known to those skilled in the art and will not be described in any further detail herein.

The filter means 511 and 514 are set as low pass filters to establish the upper limit of the primary signal frequency which the system is to monitor. These filters 511 and 514 thus rejected frequencies, from noise or representing higher signal frequencies, which are higher in frequency than those desired to be monitored in the functioning of the system. Thus, if an upper limit of primary signal frequencies to be monitored is selected to be 8.0 KHz, the cut off of the filters 511 and 514 is set at a maximum frequency of 8.0 KHz. If it is desired to monitor and respond to higher frequencies, the upper limits of the low pass filters are set to higher frequency levels.

The term "false peak" as used herein thus means a peak which is to be rejected by the system and not necessarily one that is false in the sense of being a part of system noise or an extraneous signal. The rejected peak may, in fact, be a part of the signal but at a higher frequency than the highest frequency at which a response is desired. Similarly, the term "true peak" means a peak which is desired to be detected by the system and is thus not a false peak.

The output of the signal peak detector 512 is supplied to a signal peak-to-peak detector 516 which determines the peak-to-peak value of the signal by subtracting the value of the preceding peak in the signal from the value of the present peak in the signal to arrive at a signal peak-to-peak value. The log of this peak-to-peak signal value is taken by the signal peak-to-peak detector 516 and the log of the signal peak-to-peak value is outputted at 517 to a patient prescription table EEPROM 518 and at 519 to a log subtractor 520.

The first difference peak-to-peak detector 517 calculates the peak-to-peak value of the first difference by subtracting previous peak value from the present peak value and determines the log of the peak-to-peak value of the first difference, which is outputted at 521. The log of the peak-to-peak first difference 521 is also connected to the log subtractor 520.

The log subtractor 520 subtracts the log of the peak to peak signal value from the log of the peak-to-peak first difference value to derive the log of the ratio between the two signals and hence the log of the signal frequency which is outputted at 522 to the PPT EEPROM 518. The PPT EEPROM 518 utilizes the inputs of the signal peak-to-peak value 517 and log of the signal frequency 522 to determine from the patient audio response tables stored in EEPROM 518 what the signal gain should be for that instantaneously determined signal frequency and amplitude.

This gain value is outputted as a signal 523 to a gain control EEPROM where a gain function for the signal is selected based on the signal 523. The selected gain function is applied to the digital signal 508 and the amplified digital signal 509 is connected to a digital to analog converter to realize an amplified analog signal 526. The analog signal 526 is connected through a postprocessor 527, which includes functions such as low pass filtering to eliminate sampling noise, impedance matching and drive amplification, to a micro speaker or other patient hearing interface 528.

In another embodiment of the invention, the first difference device 510 and the second difference device 513 can also be formed of analog differentiating devices such as differentiating analog amplifiers using operational amplifiers, for example. In this embodiment, the analog differentiator device 510, which yields the first difference of the signal, can be connected in series with the analog differentiator of device 513 to produce the second difference from the first difference. In either embodiment, the functions which are performed, namely the derivation of the first and second differences of the signal, are the same.

In the foregoing embodiments, the gain which is applied to the signal is repeatedly adjusted, half-cycle by half-cycle, as a function of the instantaneous values of both the frequency and amplitude of the signal in accordance with a stored patient prescription table to augment in a customized fashion the hearing response of the user. The EEPROM 518 containing the stored patient prescription table is a field programmable device which can be programmed initially at the point of application so as to be customized for a particular patient and so as to capable of being updated periodically as may necessary or desirable to match any variations in the patient's hearing response characteristics.

Another method of deriving the instantaneous frequency of the signal, which is a part of the present invention and may be used in the embodiments presented herein, involves taking the third difference f'''(t) of the signal f(t) and applying the following sequence:

Assume $f(t)=\sin \omega t$, then
$f'(t)=\omega \cos \omega t$
$f'''(t)=-\omega^3 \cos \omega t$
$\omega^2=-f'''(t)/f'(t)$
$\omega=(-f'''(t)/f'(t))^{1/2}$ Ignoring the negative sign for the absolute value, $\omega$ then equals the square root of $f'''(t)$ divided by $f'(t)$. This has the advantage of not requiring an assumption of equivalence of non-simultaneous sine and cosine peak values since it deals solely with cosine values. However, it requires a larger number of bits in its calculation and a compounded larger number of product terms in the sums. The preferred approach for the hearing enhancement device is therefore based on the ratio of the first difference to the signal because it is simpler and faster so that, for any given microprocessor, it enables greater throughput. However, the alternative approach will have other applications where the conditions to be satisfied are different from those of a portable hearing device.

It is to be understood that the embodiments presented herein are for the purpose of providing a full and clear disclosure of the present invention. Various changes and substitutions will occur to those skilled in the art, it being understood that the embodiments presented do not limit in any way the scope of the present invention as defined in the appended claims.

I claim:

1. A method of determining the instantaneous primary frequency at selected sampling points of a time varying analog signal comprising the steps of:

converting said analog signal to a digital signal by means of an analog to digital converter;

at said selected sampling points deriving the first difference of said digital signal through digital signal processing techniques;

at said selected sampling points deriving the second difference of said digital signal through digital signal processing techniques;

determining the peak-to-peak values of said digital signal by detecting the zero crossing points of said first difference;

determining the peak-to-peak values of said first difference by detecting the zero crossing points of said second difference;

dividing the peak-to-peak values of said first difference by the peak-to-peak values of said digital signal which are adjacent in time to the peak-to-peak values of said first difference to obtain in each case a ratio of the peak-to-peak value of said first difference and the peak-to-peak value of said digital signal at selected instantaneous points in time; and determining from said ratio the instantaneous primary frequency of said time varying analog signal at each of said selected instantaneous points in time.

2. The method of claim 1 including the further step of:

detecting said zero crossings of said first and second differences by detecting when said first and second differences fall below a selected minimum value threshold in each case.

3. The method of claim 1 including the further step of detecting whether zero crossings of said first and second differences represent true peaks or false peaks in the primary frequency of said digital signal and in said first difference respectively.

4. The method of claim 3 wherein the step of detecting whether zero crossings of said first difference represent a true peak or a false peak in the primary frequency of said digital includes:

detecting at the detected zero crossings of said first difference whether the direction of the polarity change of said first difference is the opposite in direction to the direction of the polarity change in the immediately preceding zero crossing representing a true peak and rejecting said zero crossings as false peak indications if the detected direction of the polarity is the same as that of the immediately preceding detected zero crossing representing a true peak.

5. The method of claim 3 wherein said step of detecting whether zero crossings of said first difference represent true peaks or false peaks in the primary frequency of said digital signal includes:

detecting whether the time period between adjacent peaks is less than a preselected threshold time duration and rejecting as false peaks those adjacent peaks which occur within time periods which are less than the preselected threshold time duration.

6. The method of claim 3 wherein said step of detecting whether zero crossings of said first difference represent true peaks or false peaks in the primary frequency of said digital signal includes:

detecting whether the peak-to-peak amplitudes of adjacent peaks are less than a preselected minimum value and rejecting as false peaks those peaks whose peak-to-peak amplitudes are less than said preselected minimum value.

7. The method of claim 5 wherein the step of detecting whether the time period between adjacent peaks is less than a preselected threshold time duration includes passing said first difference through low pass filter means.

8. A method of deriving a signal indicative of the instantaneous primary frequency at selected sampling points of a time varying signal comprising the steps of:

at said selected sampling points deriving the first difference of said signal using electronic processing techniques;

at said selected sampling points deriving the second difference of said digital signal using electronic processing techniques;

determining by electronic processing methods the peak-to-peak values of said signal by detecting the zero crossing points of said first difference;

determining by electronic processing methods the peak-to-peak values of said first difference by detecting the zero crossing points of said second difference;

dividing by electronic processing methods the peak-to-peak values of said first difference by the peak-to-peak values of said signal which are adjacent in time to the peak-to-peak values of said first difference to obtain in each case a ratio of the peak-to-peak value of said first difference and the peak-to-peak value of said signal at selected instantaneous points in time; and determining from said ratio the instantaneous primary frequency of said time varying signal at each of said selected instantaneous points in time.

9. A method as set forth in claim 8 further including the steps of detecting whether the peak-to-peak values in said signal are higher in frequency than a preselected maximum frequency and rejecting as false peaks said peak-to-peak values which are higher in frequency than said preselected maximum frequency.

10. Apparatus for enhancing human hearing response to a time varying analog audio signal comprising:

an analog to analog to digital convertor for converting said analog audio signal to a digital signal;

first connecting means for connecting said digital signal in at least a primary signal path and a secondary signal path;

digital signal processor means connected in said secondary signal path for processing said digital signal to determine the peak values and the instantaneous values of the frequency of the primary tone of said digital signal at selected time intervals and to output digital profile signals indicative of said instantaneous frequency values and the peak values of said digital signal at said selected time intervals;

a first programmable read only memory connected to said receive said digital profile signals from said digital signal processor, said first programmable read only memory having stored therein a patient prescription table indicative of a frequency response profile of the hearing response of a user of said apparatus;

means for addressing said first programmable read only memory using said digital profile signals from said digital processor means for reading out of said first programmable read only memory a gain function indicative of a desired signal gain to be applied at each of said selected time intervals based on said digital profile signal and the stored patient frequency response profile;

a second programmable read only memory connected to said digital signal in said primary data path and having stored therein gain functions for controlling the gain of said digital signal in said primary path;

said second programmable read only memory being connected to said first programmable read only memory to be addressed by said gain function and to apply to said digital signal in said primary signal path a selected gain as specified by said gain function at each of said selected time intervals to thereby output an amplified digital signal having a selected gain applied thereto at each of said time intervals based on the instantaneous frequency and peak value of said digital signal;

a digital to analog converter for converting said amplified digital signal to an amplified analog signal; and means for applying said amplified analog signal to a hearing response transducer for enhancing the hearing of a user.

11. Apparatus for enhancing human hearing response to a time varying analog audio signal as set forth in claim 10, wherein said digital signal processor means includes means for detecting zero crossings of first and second differences of said digital signal by detecting when said first and second differences fall below a selected minimum value threshold in each case, said zero crossings being used in the determination of said peak values and said instantaneous values.

12. Apparatus for enhancing human hearing response to a time varying analog audio signal as set forth in claim 11 including means for detecting at the detected zero crossings of said first difference whether the direction of the polarity change of said first difference is the opposite in direction to the direction of the polarity change in the immediately preceding zero crossing representing a true peak; and means for rejecting said zero crossings as false peak indications if the detected direction of the polarity is the same as that of the immediately preceding detected zero crossing representing a true peak.

13. Apparatus for enhancing human hearing response to a time varying analog audio signal as set forth in claim 11 including means for detecting whether the time period between adjacent peaks is less than a preselected threshold time duration; and means for rejecting as false peaks those adjacent peaks which occur within time periods which are less than the preselected threshold time duration.

14. Apparatus for enhancing human hearing response to a time varying analog audio signal as set forth in claim 11 including means for detecting whether the peak-to-peak amplitudes of adjacent peaks are less than a preselected minimum value; and means for rejecting as false peaks those peaks whose peak-to-peak amplitudes are less than said preselected minimum value.

15. Apparatus for deriving a signal indicative of the instantaneous primary frequency at selected sampling points of a time varying analog signal comprising:

an analog to digital converter for converting said analog signal to a digital signal;

first digital signal processing means for deriving at said selected sampling points the first difference of said digital signal;

second digital signal processing means for deriving at said selected sampling points the second difference of said digital signal;

third digital signal processing means for determining the peak-to-peak values of said digital signal by detecting the zero crossing points of said first difference;

fourth digital signal processing means for determining the peak-to-peak values of said first difference by detecting the zero crossing points of said second difference;

fifth digital signal processing means for dividing the peak-to-peak values of said first difference by the peak-to-peak values of said digital signal which are adjacent in time to the peak-to-peak values of said first difference to obtain in each case a ratio of the peak-to-peak value of said first difference and the peak-to-peak value of said digital signal at selected instantaneous points in time; and sixth digital signal processing means for determining from said ratio the instantaneous primary frequency of said time varying analog at each of said selected instantaneous points in time.

* * * * *